United States Patent
Hurwitz et al.

(10) Patent No.: US 12,212,119 B2
(45) Date of Patent: Jan. 28, 2025

(54) LASER SYSTEM

(71) Applicant: Analog Devices International Unlimited Company, Limerick (IE)

(72) Inventors: Jonathan Ephraim David Hurwitz, Edinburgh (GB); Eoin E. English, Pallasgreen (IE); Gavin P. Cosgrave, Enniscorthy (IE)

(73) Assignee: Analog Devices International Unlimited Company, Limerick (IE)

( * ) Notice: Subject to any disclaimer, the term of this patent is extended or adjusted under 35 U.S.C. 154(b) by 793 days.

(21) Appl. No.: 17/190,141

(22) Filed: Mar. 2, 2021

(65) Prior Publication Data

US 2021/0336402 A1   Oct. 28, 2021

Related U.S. Application Data

(60) Provisional application No. 63/014,466, filed on Apr. 23, 2020.

(51) Int. Cl.
| | | |
|---|---|---|
| *H01S 5/068* | (2006.01) | |
| *H01S 5/02257* | (2021.01) | |
| *H01S 5/02325* | (2021.01) | |
| *H01S 5/0239* | (2021.01) | |

(52) U.S. Cl.
CPC ...... *H01S 5/06825* (2013.01); *H01S 5/02257* (2021.01); *H01S 5/02325* (2021.01); *H01S 5/0239* (2021.01)

(58) Field of Classification Search
CPC .................................................. H01S 5/06825
See application file for complete search history.

(56) References Cited

U.S. PATENT DOCUMENTS

| | | | | |
|---|---|---|---|---|
| 6,215,365 | B1* | 4/2001 | Kurkovskiy | H03K 3/014 331/109 |
| 10,667,341 | B1* | 5/2020 | Kriman | G02B 27/4233 |
| 11,442,283 | B1* | 9/2022 | Whitman-Allen | H01S 5/02257 |
| 2009/0045400 | A1* | 2/2009 | Wu | H01L 23/62 257/E23.001 |
| 2015/0184993 | A1* | 7/2015 | Reitsma | H03K 17/97 324/655 |
| 2016/0046484 | A1* | 2/2016 | Cheng | B81B 7/008 438/126 |
| 2016/0086482 | A1* | 3/2016 | Hanrahan | G08B 29/046 340/506 |

(Continued)

FOREIGN PATENT DOCUMENTS

| | | | | |
|---|---|---|---|---|
| CN | 107870186 A | * | 4/2018 | G01M 11/00 |
| CN | 108196418 A | * | 6/2018 | G01M 11/00 |

(Continued)

*Primary Examiner* — Joshua King

(74) *Attorney, Agent, or Firm* — Schwegman Lundberg & Woessner, P.A.

(57) ABSTRACT

The present disclosure relates to a laser system/package that is configured to enable the detection of a change in an optical device that is intended to alter light emitted from the laser. The system is designed to measure an electric or magnetic field that is affected by the optical device. As a result, changes in the optical device, for example because the optical device has been damaged or dislodged or removed, should be detected by a corresponding change in the electric or magnetic field.

20 Claims, 9 Drawing Sheets

(56) References Cited

U.S. PATENT DOCUMENTS

| | | | |
|---|---|---|---|
| 2016/0290856 A1* | 10/2016 | Fiederling | G01J 1/4228 |
| 2017/0267175 A1* | 9/2017 | Ichikawa | F21S 41/16 |
| 2019/0120456 A1* | 4/2019 | Noda | F21S 41/28 |
| 2019/0199052 A1* | 6/2019 | Miyoshi | H01S 5/042 |
| 2019/0235351 A1* | 8/2019 | Lee | H05K 1/181 |
| 2019/0257483 A1* | 8/2019 | Hechtfischer | F21S 41/176 |
| 2019/0296522 A1* | 9/2019 | Johnson | H01S 5/02253 |
| 2019/0305512 A1* | 10/2019 | Kitajima | H01S 5/40 |
| 2020/0133018 A1* | 4/2020 | Wu | G02B 5/188 |
| 2020/0256906 A1* | 8/2020 | Fan | G06V 40/1318 |
| 2022/0021178 A1* | 1/2022 | Park | H01S 5/06825 |
| 2022/0026053 A1* | 1/2022 | Zhou | F21V 25/04 |
| 2022/0157679 A1* | 5/2022 | Lopez | H01S 5/06825 |
| 2022/0412794 A1* | 12/2022 | Miguel Sánchez | H01S 5/06825 |

FOREIGN PATENT DOCUMENTS

| | | | | |
|---|---|---|---|---|
| CN | 108767643 | A * | 11/2018 | |
| CN | 108879296 | A * | 11/2018 | |
| CN | 109379460 | A * | 2/2019 | G01S 17/89 |
| CN | 109449726 | A * | 3/2019 | |
| CN | 109543515 | A * | 3/2019 | G01N 27/041 |
| CN | 109638634 | A * | 4/2019 | |
| CN | 109751521 | A * | 5/2019 | F21V 23/003 |
| CN | 109781026 | A * | 5/2019 | G01D 18/00 |
| CN | 110531450 | A * | 12/2019 | |
| CN | 113748584 | A * | 12/2021 | H02J 50/30 |
| DE | 102016104946 | A1 * | 9/2017 | F21V 23/0457 |
| DE | 102019107831 | A1 * | 10/2019 | H01S 5/005 |
| EP | 3474392 | A1 | 4/2019 | |
| KR | 20050073401 | A * | 7/2005 | |
| KR | 20150044742 | A * | 4/2015 | |
| KR | 102087289 | B1 * | 3/2020 | |
| TW | 201244306 | A * | 11/2012 | H01J 63/02 |
| WO | WO-2017158005 | A1 * | 9/2017 | F21V 23/0457 |
| WO | WO-2019152462 | A1 * | 8/2019 | H01S 5/005 |
| WO | WO-2020027721 | A1 * | 2/2020 | H01S 5/0014 |
| WO | WO-2020078283 | A1 | 4/2020 | |
| WO | WO-2020122815 | A1 * | 6/2020 | H01S 5/005 |
| WO | WO-2020130937 | A1 * | 6/2020 | F21V 25/02 |
| WO | WO-2020148772 | A1 * | 7/2020 | H02J 50/30 |
| WO | WO-2020177710 | A1 * | 9/2020 | F21V 23/003 |
| WO | WO-2020197496 | A1 * | 10/2020 | F21V 25/02 |
| WO | WO-2020204404 | A1 * | 10/2020 | G01J 1/44 |
| WO | WO-2021010903 | A1 * | 1/2021 | G01N 27/20 |
| WO | WO-2021039199 | A1 * | 3/2021 | H01S 5/0014 |
| WO | WO-2021107862 | A1 * | 6/2021 | A61B 5/0095 |
| WO | WO-2021126086 | A1 * | 6/2021 | H01S 5/02253 |

* cited by examiner (a)

(b)

(c)

(d)

LASER SYSTEM

CLAIM OF PRIORITY

This application claims priority to U.S. Provisional Application Ser. No. 63/014,466, filed on Apr. 23, 2020, which is hereby incorporated by reference in its entirety.

BACKGROUND

Laser illumination sources emit coherent light that can be harmful to human eyes and/or skin to different degrees of severity at different power levels and different wavelengths. Often, lasers are packaged in sealed enclosures that include an optical diffuser through which the laser light passes before being emitted. For example, Time of Flight (ToF) camera systems often include a laser system/module that has a laser light source and a diffuser designed to diffuse the emitted light over a larger area to increase imaging area. By increasing the area over which the emitted light is spread, the radiant exposure (energy density, measured in $J\ cm^{-2}$) and irradiance (power density, measured in $W\ cm^{-2}$) decreases. In order to maintain effective operation of the ToF camera system, the laser may have an optical energy/power that would exceed safe limits if the diffuser were not present, but is within safe limits when the diffuser is present. In other words, the laser module is safe for human eyes and/or skin when the diffuser is present, but if it is removed or knocked out of the laser module, it may then become dangerous for human eyes and/or skin.

Consequently, laser modules of this type are typically packaged in robust, sealed enclosures to minimise the risk of the diffuser being lost during the operational lifetime of the product. However, it is still feasible for service repair workers and/or owner repairers to net access to the laser module and attempt to remove the optical diffuser, or accidentally dislodge the optical diffuser. Additionally or alternatively, it is possible for the optical diffuser to fall out due to mechanical shock, or for there to be an undetected mis-assembly of the laser module, or other fault condition that may allow at least some un-diffused light to be emitted from the laser system.

SUMMARY

The present disclosure relates to a laser system/package that is configured to enable the detection of a potentially dangerous dislocation/removal/damage of an optical device that is intended to alter light emitted from the laser. The system is designed to measure an electric or magnetic field that is affected by the optical device. As a result, changes in the optical device, such as its position of the optical device relative to the laser or damage to the optical device, should be detected by a corresponding change in the electric or magnetic field.

In a first aspect of the disclosure, there is provided a laser system comprising: a housing; a laser light source in the housing; an optical device fitted to the housing and arranged such that laser light emitted by the laser light source passes through the optical device; at least one conductive element formed on at least part of the optical device; a first sensing element in the housing; and a measurement/sensing circuit coupled to the first sensing element and configured to measure a characteristic that is indicative of a field between the at least one conductive element and the first sensing element.

The field between the at least one conductive element and the first sensing element may comprise an electric field, and wherein the measured characteristic comprises a capacitance that is dependent on the electric field.

The laser system may further comprise a second sensing element mounted in the housing and coupled to the measurement circuit, wherein the measured characteristic comprises a mutual capacitance between the first sensing element and the second sensing element.

The measured characteristic may be further indicative of an electric field between the at least one conductive element and the second sensing element.

The first sensing element may be a conductive element arranged to be capacitively coupled to the at least one conductive element.

The field between the at least one conductive element and the first sensing element may comprise a magnetic field, and wherein the first sensing element comprises a first coil, and wherein the measurement circuit is configured to apply a current to the first coil to induce a first magnetic field. The characteristic may comprise an inductance of the first coil.

The measurement circuit may comprise a capacitor that is coupled to the first coil to form an LC tank, wherein the measurement circuit is configured to measure the inductance of the first coil by determining a resonant frequency of the LC tank.

The laser system may further comprise a second coil coupled to the measurement circuit, wherein the characteristic comprises a current induced in the second coil by the first magnetic field.

The laser system may further comprise a magnetic sensor coupled to the measurement circuit, wherein the characteristic comprises the first magnetic field measured using the magnetic sensor.

The measurement circuit may be further configured to compare the measured characteristic against a reference value to determine whether or not the optical device should be functioning correctly.

Operation of the laser light source may be based at least in part on the comparison of the measured characteristic against the threshold value.

The at least one conductive element may be formed as a film layer on at least part of a surface of the optical device.

The first conductive sensing element is optically transparent.

The optical device may be a non-contact optical device such that does not have any electrical connection ports.

In a second aspect of the disclosure, there is provided a time of flight camera system, comprising the laser system of the first aspect.

In a third aspect of the disclosure, there is provided a method for sensing an optical device within a laser system, wherein the optical device comprises at least one conductive element formed on at least part of the optical device, and wherein the laser system comprises a laser light source, arranged such that emitted laser light passes through the optical device, and a first sensing element mounted in a fixed position relative to the laser light source, the method comprising: sensing the optical device by measuring a characteristic that is indicative of a field between the at least one conductive element and the first sensing element.

The measured characteristic may comprise a capacitance that is dependent on the field between the at least one conductive element and the first sensing element.

In a fourth aspect of the disclosure, there is provided a laser assembly comprising: a laser; an optical device arranged to alter light emitted from the laser; and a sensing circuit configured to measure a characteristic indicative of a field that is affected by the optical device.

The laser assembly may further comprise a first sensing element coupled to the sensing circuit and configured to create the field that is affected by the optical device; wherein the optical device comprises at least one conductive element, and wherein the sensing circuit is not electrically connected to the at least one conductive element.

The optical device may comprise at least one conductive element coupled to the sensing circuit and configured for use in creating the field that is affected by the optical device, wherein the laser assembly may also further comprise a first sensing element coupled to the sensing circuit and configured for use by the sensing circuit in measuring the characteristic indicative of the field that is affected by the optical device. The field that is affected by the optical device may be a magnetic field generated using the at least one conductive element, and wherein the sensing circuit is configured to measure the magnetic field using the first sensing element. Alternatively, the field that is affect by the optical device may be an electric field caused by a capacitance between the at least one conductive element and the sensing element, and wherein the sensing circuit is configured to measure the capacitance.

ASPECTS OF THE DISCLOSURE

Example aspects of the disclosure are set out, by way of non-limiting example, in the following numbered clauses.
1. A laser system comprising:
   a laser light source for emitting laser light;
   an optical diffuser arranged to diffuse the laser light;
   a first conductive sensing element formed on at least part of the optical diffuser; and
   a second conductive sensing element, wherein the first conductive sensing element is arranged relative to the second conductive sensing element in such a way that the first conductive sensing element and the second conductive sensing element form a first capacitive sensor.
2. The laser system of aspect 1, wherein the first conductive sensing element is in a fixed position relative to the laser light source.
3. The laser system of any preceding aspect, further comprising:
   a third conductive sensing element arranged relative to the first conductive sensing element in such a way that the first conductive sensing element and the third conductive sensing element form a second capacitive sensor.
4. The laser system of aspect 3, wherein the third conductive sensing element is in a fixed position relative to the laser light source and the first conductive sensing element.

The laser system of aspect 3 or aspect 4, wherein a mutual capacitance between the first conductive sensing element and the third conductive sensing element is indicative of a position of the optical diffuser relative to the first conductive sensing element and/or the third conductive sensing element.
6, The laser system of aspect 5, further comprising a measurement circuit configured to measure the mutual capacitance between the first conductive sensing element and the third conductive sensing element.
7. The laser system of aspect 6, wherein the measurement circuit is further configured to compare the measure of mutual capacitance against a reference capacitance.
8. The laser system of aspect 7, wherein the reference capacitance is indicative of a mutual capacitance between first conductive sensing element and the third conductive sensing element when the optical diffuser is correctly in position relative to the first conductive sensing element and/or the third conductive sensing element.
9. The laser system of aspect 7, wherein the reference capacitance is indicative of a safe operational capacitance for the mutual capacitance between first conductive sensing element and the third conductive sensing element.
10. The laser system of any of aspects 7 to 9, wherein operation of the laser light source is based at least in part on the comparison of the measure of mutual capacitance against the reference capacitance.
11. The laser system of any preceding aspect, wherein the first conductive sensing element is formed as a film layer on at least part of a surface of the optical diffuser.
12. The laser system of aspect 11, wherein the first conductive sensing element is optically transparent.
13. The laser system of aspect 12, wherein the first conductive sensing element comprises indium tin oxide, ITO.
14. The laser system of any preceding aspect, further comprising a fourth conductive sensing element formed on at least part of the optical diffuser.
15. The laser system of aspect 14, wherein the fourth conductive sensing element is arranged relative to the second conductive sensing element in such a way that the fourth conductive sensing element and the second conductive sensing element form a third capacitive sensor.
16. The laser system of aspect 14, wherein the fourth conductive sensing element is arranged relative to the third conductive sensing element in such a way that the fourth conductive sensing element and the third conductive sensing element form a third capacitive sensor.
17. The laser system of any preceding aspect 1, further comprising:
   a housing, wherein the laser and the first conductive sensing element are arranged in a fixed position relative to the housing.
18. The laser system of aspect 1, further comprising:
   a measurement circuit electrically coupled to the first conductive sensing element and the second conductive sensing element, wherein the measurement circuit is configured to measure the a capacitance between the first conductive sensing element and the second conductive sensing element.
19. A time of flight camera system, comprising the laser system of any preceding aspect.
20. A method for determining a position of an optical diffuser within a laser system, wherein the optical diffuser comprises a first conductive sensing element formed on at least part of the optical diffuser, the method comprising:
   measuring a capacitance that is indicative of the position of the an optical diffuser within the laser system using a second conductive sensing element of the laser system, wherein the first conductive sensing element is arranged relative to the second conductive sensing element in such a way that the first conductive sensing element and the second conductive sensing element form a first capacitive sensor.
21. The method of aspect 20, wherein the laser system further comprises a third conductive sensing element and the measured capacitance comprises a mutual capacitance between the first conductive sensing element and the third conductive sensing element.

22. The method of aspect 20 or aspect 21, further comprising:
comparing the measured capacitance against a reference capacitance to determine whether or not the optical diffuser is correctly positioned in the laser system.

23. A laser system comprising:
a laser light source for emitting laser light;
an optical diffuser arranged to diffuse the laser light;
a first conductive element formed on at least part of the optical diffuser;
a second conductive element; and
a measurement circuit coupled to the second conductive element and configured to measure a characteristic that is indicative of a field between the first conductive element and the second conductive element.

24. The laser system of aspect 23, wherein the field between the first conductive element and the second conductive element comprises an electric field, and wherein the measured characteristic comprises a capacitance that is dependent on the electric field.

25. The laser system of aspect 23, wherein the field between the first conductive element and the second conductive element comprises a magnetic field, and wherein the second conductive element comprises a first coil configured to induce the magnetic field.

26. The laser system of aspect 25, wherein the measurement circuit is configured to measure an inductance of the first coil.

27. The laser system of aspect 26, wherein the measurement circuit comprises a capacitor that is coupled to the first coil to form an LC tank, and wherein the measurement circuit is configured to measure the inductance of the first coil by determining a resonant frequency of the LC tank.

28. The laser system of aspect 25, further comprising a second coil coupled to the measurement circuit, and wherein the measurement circuit is configured to measure a current induced in the second coil by the magnetic field.

29, The laser system of aspect 25, further comprising a magnetic sensor coupled to the measurement circuit, and wherein the measurement circuit is configured to use the magnetic sensor to measure the magnetic field.

DRAWINGS

Aspects of the present disclosure are described, by way of example only, with reference to the following drawings, in which.

The drawings are schematic and representative only. They are not drawn to scale.

DETAILED DESCRIPTION

In the present disclosure, a new laser system is disclosed that enables an optical device of the system, for example an optical diffuser or lens, to be detected throughout the lifetime of the laser system. The optical device includes at least one conductive element, for example formed of ITO, One or more sensing elements can be mounted in a fixed position relative to the laser light source. Those one or more sensing elements can be used to measure a capacitance or inductance that changes with any changes in the capacitive or inductive coupling between the optical device conductive elements and the one or more sensing elements. Thus, if the optical device is removed, or becomes partially or fully dislodged, or is damaged, the measurement of capacitance/inductance should change, thereby indicating the laser system may not be safe to operate any longer. Optionally, the laser may be disabled if the measurement of capacitance/inductance indicates potentially unsafe operation.

Figure 1A:
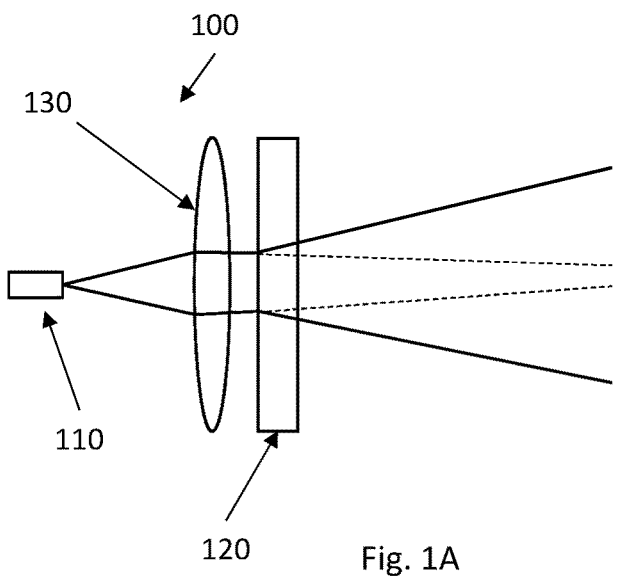
FIGS. 1A, 1B and 1C show three typical examples of laser systems/assemblies, which demonstrate the diffusing effect that optical diffusers have on laser light.
Figure 1B:
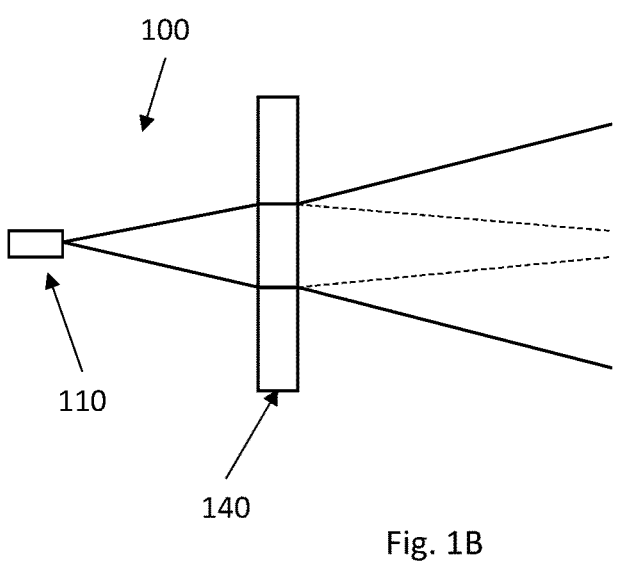
Figure 1C:
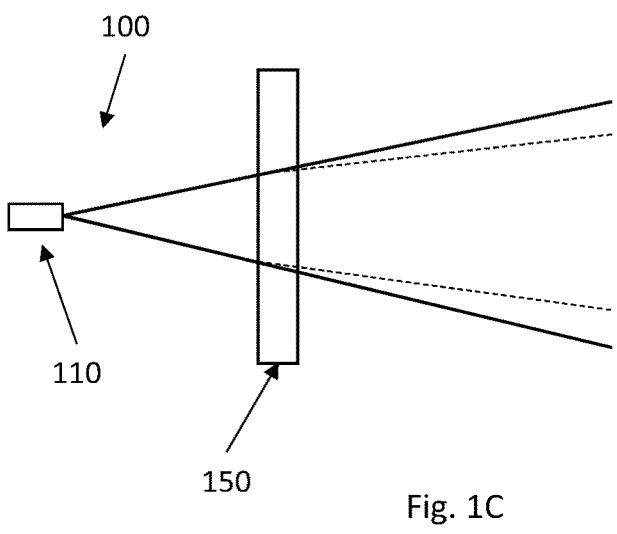

FIGS. 1A, 1B and 1C show three typical examples of laser systems/assemblies, which demonstrate the diffusing effect that optical diffusers have on laser light. FIG. 1A shows a laser system/assembly 100 comprising a laser 110, a refractive lens 130 and a diffractive optical diffuser 120, Light emitted from the laser 110 passes through a refractive lens 130 and then a diffractive optical diffuser 120. FIG. 1B shows a laser system/assembly 100 comprising a laser 110 and a combined refractive lens and diffractive diffuser 140. Light emitted from the laser 110 passes through the combined refractive lens and diffractive diffuser 140. FIG. 1C shows a laser system/assembly 100 comprising a laser 110 and a combined diffractive lens and diffractive diffuser 150. Light emitted from the laser 110 passes through the combined diffractive lens and diffractive diffuser 150.

Optical diffusers are used to homogenize light and expand a narrower source light into a broader range of angles. In each example in FIGS. 1A-IC, the light beams represented by the solid lines represent the light path when the optical diffusers are present. It can be seen that the light emitted from the optical diffusers expands over a relatively broad range of angles, resulting in relatively lower optical power per unit area. The dotted lines represent the light path that would occur if the optical diffusers were not present. It can be seen that in this case the light would expand over a relatively narrow range of angles, resulting in relatively higher optical power per unit area. If the optical power of the laser 110 is set such that the light emitted from the laser system/assembly 100 is normally within safe limits (for example, the power per unit area is below maximum allowable limits), it can be seen that anything that affects the operation of the optical diffuser (for example, damage, removal, dislodging, mis-fitting, or any other fault) may result in at least partially un-diffused light emitting from the system/assembly. The greater power per unit area of that light may exceed maximum allowable limits and therefore be dangerous.

Figure 2A:
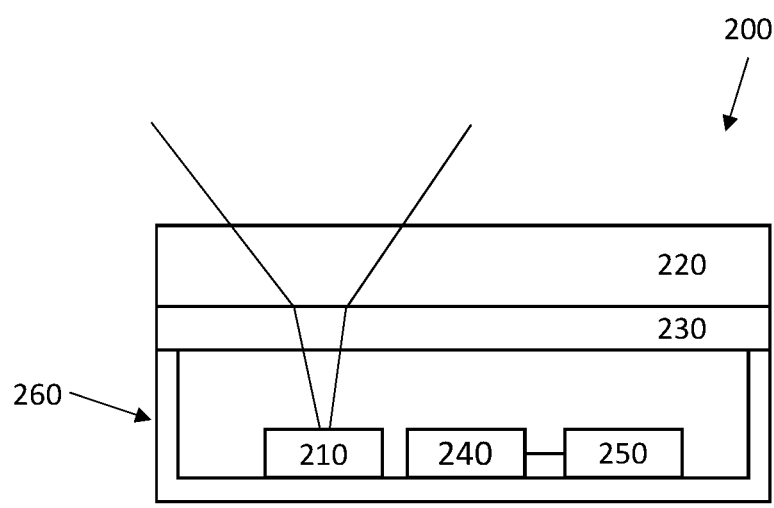
FIG. 2A shows an example schematic representation of a side-on view of a laser system/assembly in accordance with an aspect of the present disclosure.

FIG. 2A shows an example schematic representation of a side-on view of a laser system/assembly 200 in accordance with an aspect of the present disclosure. The laser system 200 comprises a laser 210 mounted in a housing 260, which may be any type of laser (for example, a VCSEL), an optical device 220 fixed to the housing 260, which may be any type of optical device configured to alter or affect the laser light, such as an optical diffuser or an optical lens/diffractive element configured to project the laser light as a dot pattern and at least one conductive element 230 that is formed on the optical device 220. The at least one conductive element 230 may be formed using an optically transparent film, for example indium tin oxide (ITO). The term "optically transparent" should be understood to mean that the light absorption of the film is sufficiently low for the system 200 to emit a functional amount of light (i.e., an amount of light that is sufficient for the operational purposes of the laser system 220).

The laser system/assembly 200 also comprises a first sensing element 240 mounted in the housing 260 such that it is in a fixed position relative to the laser 210, and a measurement circuit 250 (also referred to as a sensing circuit 250) that is electrically coupled to the first sensing element 240 and configured to sense the integrity of the optical element 220 (for example, sensing whether integrity of the optical element 220 has been lost by damage and/or dislodging and/or removal etc, such that it may no longer properly perform its function) by measuring a characteristic that is indicative of a field (such as an electric field or a magnetic field) that is affected or changed with changes to the at least one conductive element 230 (such as damage to the at least one conductive element and/or a change in position of the at least one conductive element 230 relative to the first sending element 240). In this example aspect of the disclosure, the first sensing element 240 is a conductive element arranged to capacitively couple with the at least one conductive element 230, such that the first sensing element 240 effectively forms one conductive plate of a capacitor and the at least one conductive element 230 forms the other conductive plate of the capacitor. Therefore, in the explanation below the first sensing element 240 is often referred to as a first capacitive sensing element 240.

Figure 2B:
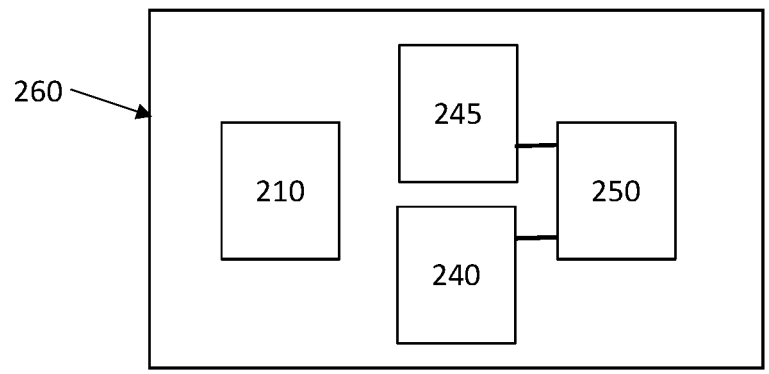
FIG. 2B shows an example schematic representation of a top-down view of the laser system/assembly of FIG. 2A.

FIG. 2B shows an example schematic representation of a top-down view of the laser system/assembly 200. The laser system 200 also comprises a second sensing element 245, which is electrically conductive and is electrically coupled to the measurement circuit 250. In this example aspect of the disclosure, the second sensing element 245 is also a conductive element arranged to capacitively couple with the at least one conductive element 230, such that the second sensing element 245 effectively forms a conductive plate of a further capacitor and the at least one conductive element 230 forms the other conductive plate of the further capacitor. Therefore, in the explanation below the second sensing element 245 is often referred to as a second capacitive sensing element 245. The first capacitive sensing element 240 and the second capacitive sensing element 245 may each be made of any suitable electrically conductive material (for example, copper) and be of any suitable size and shape. They may be the same size and shape as each other, or different. Likewise, they may be made of the same material as each other, or different.

The at least one conductive element 230 may be, for example, a single conductive element that covers at least part of the surface of the optical device 220. Alternatively, it may be two or more conductive elements, each of which cover a different part of the surface of the optical device 220.

Figure 3:
FIG. 3 shows four different, non-limiting examples of configurations of the at least one conductive element of FIG. 2A.
Figure 3:
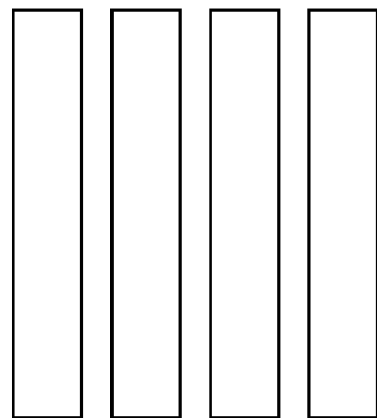
Figure 3:
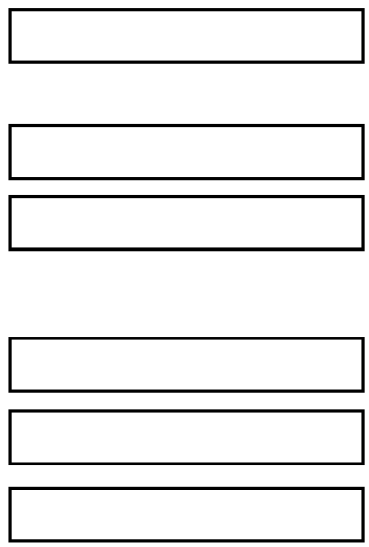
Figure 3:
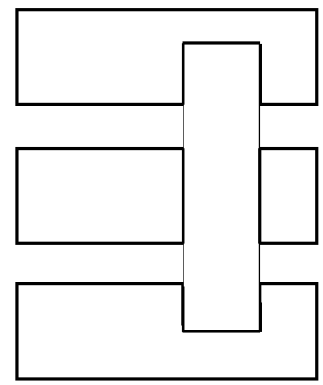

FIG. 3 shows four different, non-limiting examples of top-down views of configurations of the at least one conductive element 230. Example (a) shows a single conductive element 230 that may cover some or all of the surface of the optical device 220. Example (b) shows a plurality of strips of conductive elements 230. Example (c) shows a plurality of strips of conductive elements 230, in a different orientation. Example (d) shows a different arrangement of a plurality of strips of conductive elements 230. It will be appreciated that each of the at least one conductive element 230 may have any suitable size or shape, and be positioned on any suitable part of the optical device 220. Furthermore, in some example optical device devices, there may be an optical part through which light maybe pass and be diffused, and a mounting/housing part in which the optical part sits, for example a plastic surround. The term "optical device" herein encompasses both optical only devices, and optical plus mounting/housing devices, such that the at least one conductive element 230 may be formed on the optical part and/or the mounting/housing part.

Figure 4A:
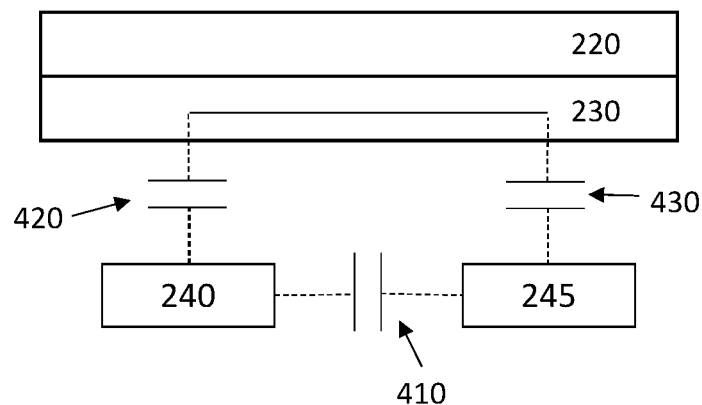
FIGS. 4A and 4B show example schematic, side-on, representations of capacitive coupling between the capacitive sensing elements and the at least one conductive element of the system of FIG. 2A.

FIG. 4A shows an example schematic, side-one, representation of capacitive coupling between the capacitive sensing elements 240, 245 and the at least one conductive element 230. As can be seen, the first capacitive sensing element 240 is capacitively coupled to the at least one conductive element 230 to form a first capacitive sensor 420 (i.e., the first capacitive sensing element 240 and the at least one conductive element 230 act as a pair of conductive plates, separated by a dielectric, which in this example may be a gas such as air). Likewise, the second capacitive sensing element 245 is capacitively coupled to the at least one conductive element 230 to form a second capacitive sensor 430 (i.e., the second capacitive sensing element 245 and the at least one conductive element 230 act as a pair of conductive plates, separated by a dielectric, which in this example may be a gas such as air). In this example, the same at least one conductive element 230 forms part of both the first capacitive sensor 420 and the second capacitive sensor 430 (for example, because there is a single conductive element 230, like the example FIG. 3(a), or because the same conductive element strip is positioned over both the first and second capacitive sensing element 240, 245). Consequently, the first capacitive sensor 420 and the second capacitive sensor 430 are electrically coupled in this example. The first capacitive sensing element 240 and the second capacitive sensing element 245 are positioned relative to each other such that they have a mutual capacitance 410. However, each capacitive sensing element 240, 245 may be capacitively coupled to any one or more conductive elements on the optical device 220, to a greater or lesser extent, and may or may not each be capacitively coupled to the same conductive element(s) on the optical device 220.

It will be appreciated that the capacitances 420 and 430 are dependent on the dielectric constant, e, between the two conductors, the area, A, of the conductive plates and the distance, d, between the conductive plates (C=eA/d). The measurement circuit 250 is configured to measure the mutual capacitance 410 between the first and second capacitive sensing elements 240, 245. It will be appreciated that owing to the capacitive coupling, the effective capacitance between the capacitive sensing elements 240 and 245, and therefore the measure of mutual capacitance 410, is dependent on the capacitances 420 and 430. Therefore, if the capacitances 420 and 430 change, the measure of mutual capacitance 410 will change.

Figure 4B:
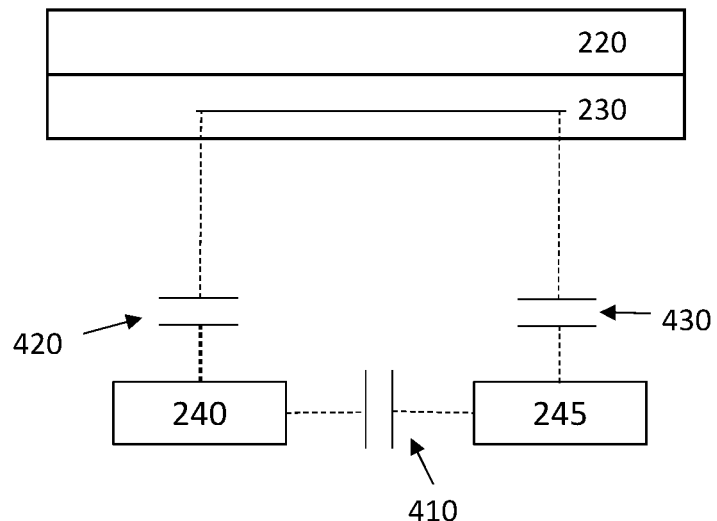

FIG. 4B shows a further example schematic, side-one, representation of capacitive coupling between the capacitive sensing elements 240, 245 and the at least one conductive element 230. This is very similar to the example of FIG. 4A, but the position of the optical device 220, and therefore the at least one conductive element 230, is further away from the capacitive sensing elements 240, 245. This greater distance will reduce the capacitances 420 and 430, which will change the measure of mutual capacitance 410 compared with the example of FIG. 4A.

Figure 4C:
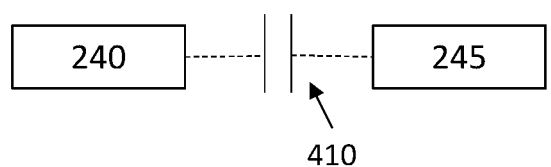
FIG. 4C shows an example schematic, side-on, representation of capacitive coupling when the optical device of the system of FIG. 2A is removed.

FIG. 4C shows a further example schematic, where the optical device 220 has been removed entirely. Consequently, the capacitive coupling 420 and 430 has been removed, such that again the measure of mutual capacitance 410 will change compared with the example of FIG. 4C.

Figure 5A:
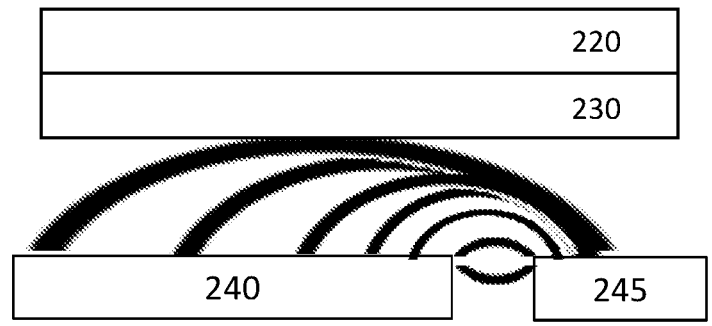
FIGS. 5A and 5B show example schematics of electric fields between the capacitive sensing elements of the system of FIG. 2A.
Figure 5B:
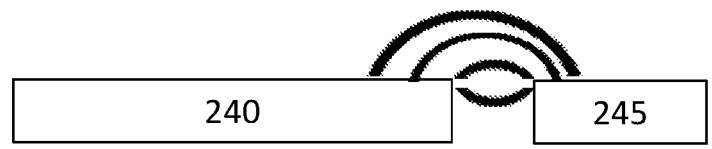

FIG. 5A shows an example schematic of an electric field between the capacitive sensing elements 240, 245 when the optical device 220 is correctly in place, corresponding, for example, to FIG. 4A. It will be appreciated that changes in the relative distance between the at least one conductive element 230 and the first sensing element 240 will change the electric field between the at least one conductive element 230 and the first sensing element 240, which results in a change in the capacitance 420. This in turn will change the mutual capacitance 410 between the first sensing element 240 and the second sensing element 245, for the reasons explained earlier. FIG. 5B shows an example schematic of an electric field between the capacitive sensing elements 240, 245 when the optical device 220 is removed. It can be seen that the E-field is quite different, which results in a difference in the measured mutual capacitance 410, Likewise, damage to any of the at least one conductive element 230 may also alter the E-field, which results in a difference in the measured mutual capacitance 410, thereby enabling the damage to be sensed. Furthermore, the extent of any damage to the optical device 220 may be sensed by virtue of the amount of change in the E-field detected by the measured mutual capacitance. In addition, where there are two or more conductive elements 230 (for example, as shown in FIGS. 3b-3d), damage in one area of the optical device 220 may only affect one of the conductive elements 230, thereby limiting the amount of change to the E-field. In contrast, extensive damage across the optical device 220 may affect many more of the conductive elements 230, resulting in a significant change to the E-field. As a result, the presence of two or more conductive elements 230 may even further help in sensing the extent of damage of the optical device 220.

If FIG. 4A represents the optical device 220 in its correct position, it will be appreciated that throughout the lifetime of the system 220, the measure of mutual capacitance 410 can be indicative of the integrity of the optical device 220, in particular indicating whether or not the optical device 220 should still be functioning correction, for example that it is still in its correct position and/or that it is not damaged. For example, a change in mutual capacitance 410 may indicate that the electric field between the first sensing element 240 and the at least one conductive element 230 has changed as a result of the optical device 220 having moved position, or been removed entirely, or damaged, thereby potentially rendering the laser system 200 unsafe for further use. Thus, the measurement circuit 250 may be configured to intermittently (for example, periodically, or prior to each time the laser 210 is to be turned on) measure the mutual capacitance 410 in order to sense the integrity of the optical device 220. For example, the measurement circuit 250 may be coupled to a laser driver circuit (not represented in the Figures) and it may output an optical device integrity signal, which can be indicative of whether or not the optical device 220 should still be functioning correctly. The laser driver may be configured to drive the laser 210 to emit light only if the signal indicates that the optical device 220 should be functioning correctly. Alternatively, the measurement circuit 250 may be part of the laser driver itself, such that the laser driver is coupled to the capacitive sensing elements 240, 245 and configured to perform the functionality of the measurement circuit 250 described herein.

The measurement circuit 250 may be configured to measure the mutual capacitance 410 and compare it against a reference capacitance. The reference capacitance may, for example, be stored in memory, such as within the measurement circuit 250 or elsewhere accessible to the measurement circuit 250. It may be a value determined at time of device manufacture/configuration, when the mutual capacitance indicative of the optical device 220 being in an undamaged condition and in the correct position, or it may be a value that is set based on an understanding of approximately what the mutual capacitance should be when the optical device 220 is correctly positioned. The reference capacitance may be a value corresponding to the capacitance when the optical device 220 should be functioning correctly, in which case the measurement circuit 250 may allow a tolerance either side of the reference capacitance (for example, to allow for measurement noise, etc), within which the optical device 220 is deemed to be functioning correctly. Alternatively, it may comprises a threshold(s) for allowable mutual capacitance, outside of which the optical lens 220 is deemed not to be functioning correctly.

The measurement circuit 250 may be configured to measure the mutual capacitance 410 in any suitable way. For example, it may be configured to use an impedance measurement based on discrete Fourier transform, such as that described here: https://www.analog.com/en/products/ad5933.html, or by applying an oscillation signal to the capacitive sensing elements 240, 245, as described here: https://en.wikipedia.org/wikiCapacitive_sensing Thus, it can be seen that according to the disclosures herein, the laser system 200 can be configured such that a potentially dangerous change in optical device 220 can be quickly detected. Furthermore, by implementing the two capacitive sensing elements 240, 245 and sensing the change in optical device 220 based on a change in the mutual capacitance 410, the laser system 220 may be manufactured without requiring any electrical connections (for example, wiring) to the optical device 220, in particular no electrical connection between the measurement circuit 250 (or any other electrical component of the system) and the conductive element 230 (i.e., the at least one conductive element 230 is an electrically isolated element or a passive element, in that it is not electrically driven or physically electrically coupled to anything). In other words, the system 200 is configured to enable indirect, or non-contact, sensing of the optical device 220, in that there is no physical electrical connection (which as wiring) between the circuit 250 and the optical device 220. This keeps manufacture of the laser system 200 straightforward and relatively low cost.

Figure 6A:
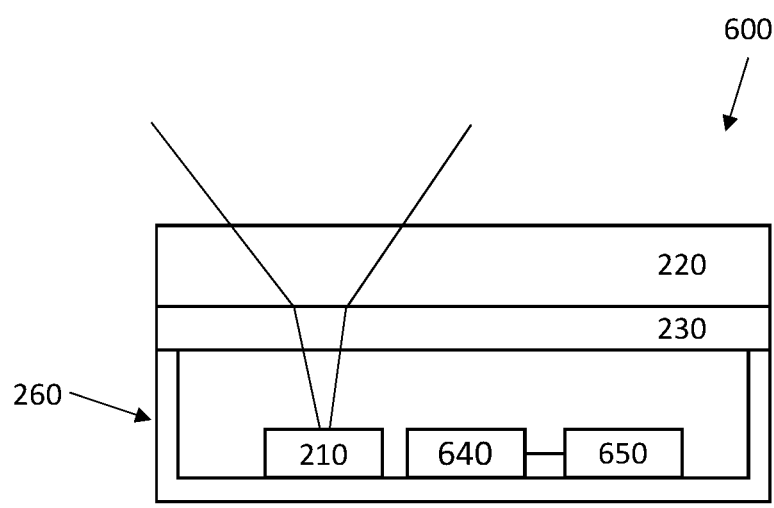
FIG. 6A shows an example schematic representation of a side-on view of a laser system/assembly in accordance with a further aspect of the present disclosure.
Figure 6B:
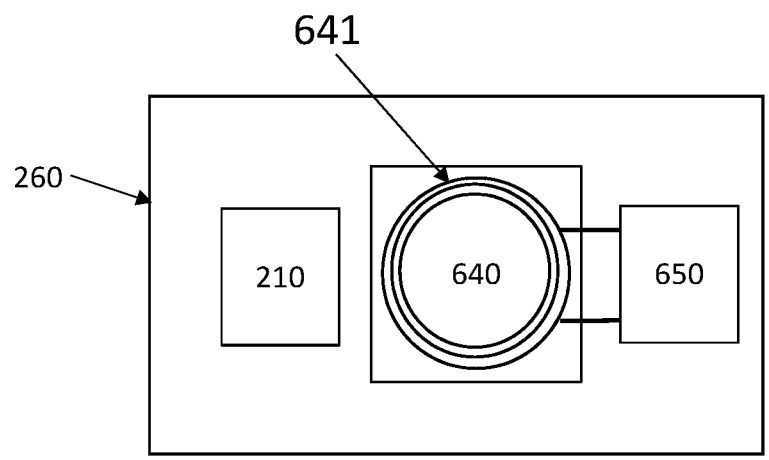
FIG. 6B shows an example schematic representation of a top-down view of the laser system/assembly of FIG. 6A.

FIGS. 6A and 6B show example schematic representations of side-on and top-down views of a laser system/assembly 600 in accordance with an aspect of the present disclosure. The laser system/assembly 600 is configured to sense of the optical device 220 using inductive sensing.

The system comprises a first sensing element 640 and a measurement circuit 650. In this example, the system 600 is configured to measure a characteristic indicative of a magnetic field between the first sensing element 640 and the conductive element 230. The first sensing element 640 comprises a coil 641 (represented in FIG. 6B) that forms an inductor. The coil 641 is configured to generate a magnetic field when an alternating current is passed through it by the measurement circuit 650. The AC signal applied to the coil 641 may be any form of alternating signal, for example signals that achieve frequency interference mitigation, such as the type described in US2016/0363462 A1, which is incorporated herein by reference in its entirety, and/or it may frequency hop and/or it may be a combination of sequential frequencies to rule out interferences.

Figure 6C:
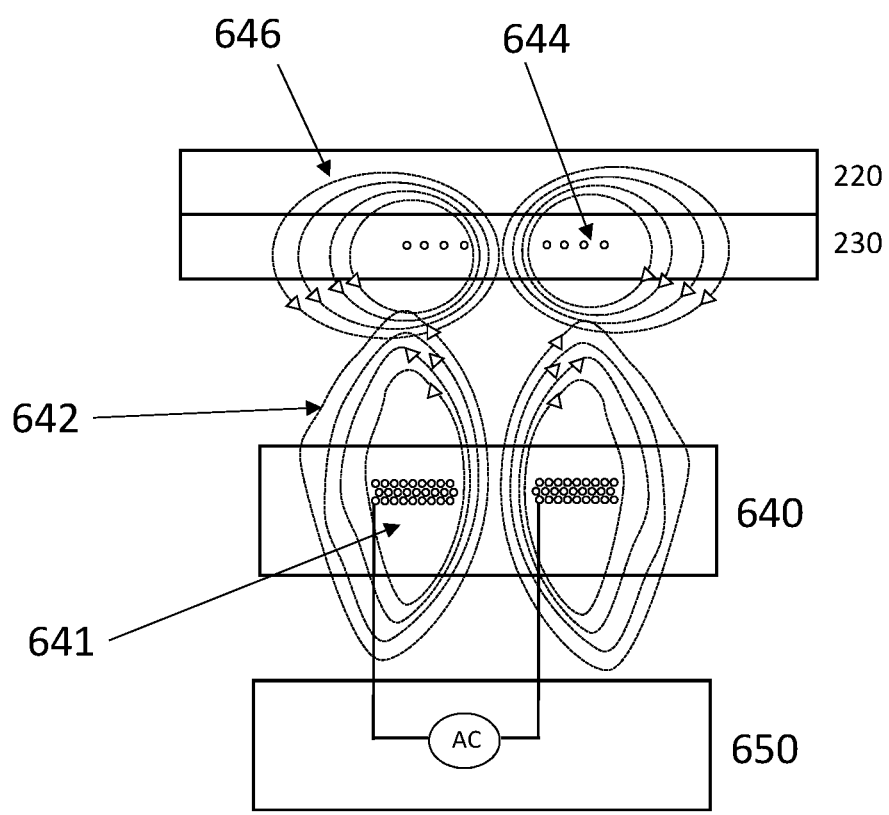
FIG. 6C shows an example schematic, side-on, representation of magnetic fields of the laser system/assembly of FIG. 6A.

FIG. 6C shows a representation of a magnetic field (B-field) 642 induced by an alternating current applied to the coil 641. This in turn induces eddy currents 644 in the at least one conductive element 230, which creates a magnetic field 646 that opposes the magnetic field 642. This has an effect on the inductance of coil 641. Changes in the optical device 220 will change the electric field between the first sensing element 640 and the conductive element 230, which in turn changes the inductance of coil 641, Therefore, the characteristic that the measurement circuit 650 is configured to measure in this example is the inductance of the coil 641. The measurement circuit 650 may be configured to measure the inductance of the coil 641 in any suitable way (not represented in FIGS. 6A-6C). For example, the measurement circuit 650 may comprise a capacitor of known capacitance that is coupled to the coil 641 to form an LC tank. The measurement circuit 650 may also comprise any suitable circuitry for measuring the resonant frequency of the LC tank, which will change with changes in inductance. Optionally, the determined resonant frequency/inductance of the coil 641 may be compared against a reference value that is indicative of the optical device 220 being correctly positioned (similarly to the above description of the determined capacitance being compared against a reference capacitance). Thus, it can be seen that damage/removal/dislodging/mis-alignment, etc, of the optical device 220 may be detected based on the inductance of the coil 641, through non-contact (indirect) sensing of the optical device 220 without requiring a physical electrical connection to the optical device 220 (in particular, no electrical connection is required between the at least one conductive element 230 and the measurement circuit 650).

Figure 7A:
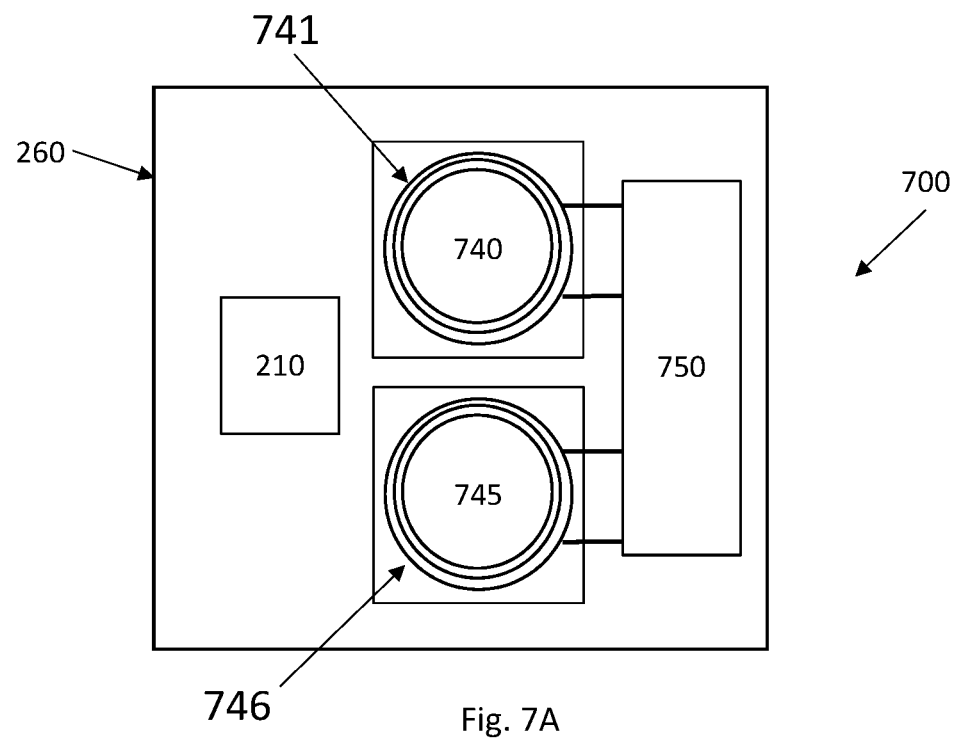
FIG. 7A shows an example schematic representation of a laser system/assembly in accordance with a further aspect of the present disclosure.

FIG. 7A shows an example schematic representation of a top-down view of a laser system/assembly 700 in accordance with an aspect of the present disclosure. The system 700 is very similar to the system 600, but the technique for sensing the optical device 220 is different.

The system 700 comprises a first sensing element 740, which has a first coil 741, coupled to a measurement circuit 750. The system 700 also comprises a second sensing element 745, which has a second coil 746, and is coupled to the measurement circuit 750. The measurement circuit 750 is configured to apply an alternating current to the coil 741 to induce a magnetic field, in the same way as described above.

Figure 7B:
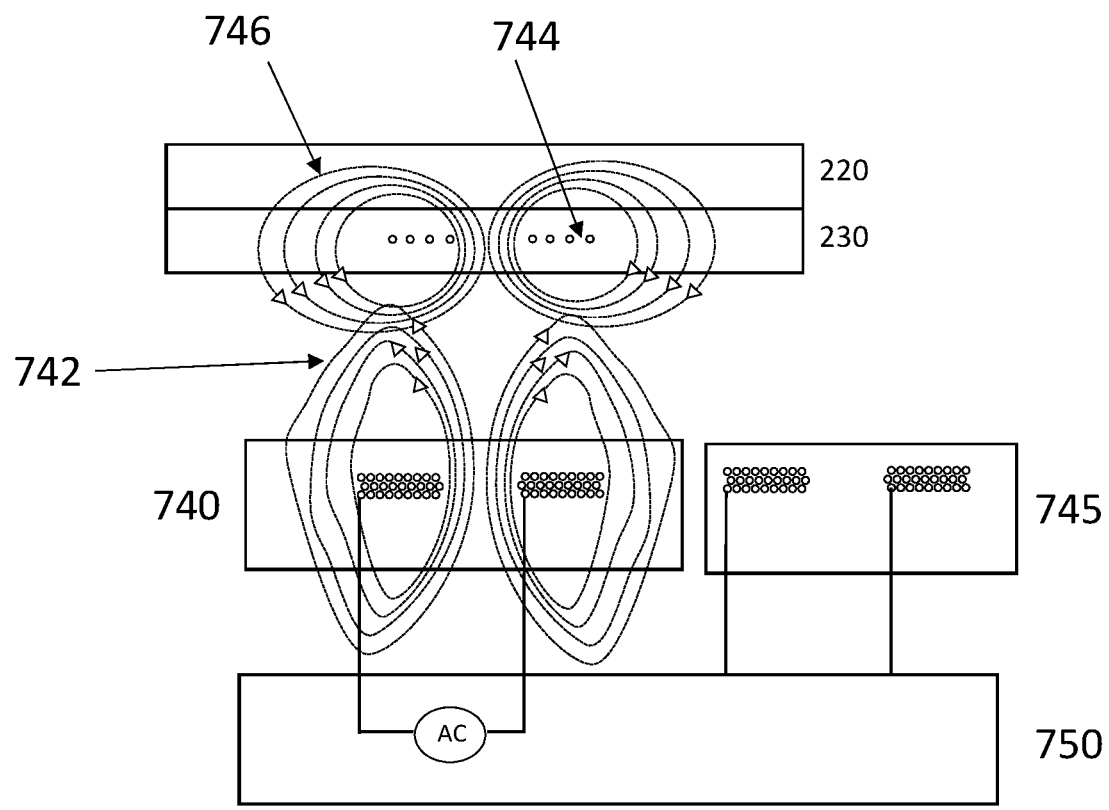
FIG. 7B shows an example schematic, side-on, representation of magnetic fields of the laser system/assembly of FIG. 7A.

FIG. 7B shows a representation of a magnetic field (B-field) 742 induced by an alternating current applied to the coil 741. It also shows eddy currents 744 in the at least one conductive element 746, and induced magnetic field 746, similarly to those described above with reference to FIG. 6C. As described above, the magnetic field 746 affects the magnetic field 742.

The effect, or distortion, on the magnetic field between the first sensing element 740 and the conductive element 230 may affect current induced in the second coil 745. If the optical device 220 changes, for example it is damaged, or dislodged or removed entirely, the effect of the magnetic field 746 (or the absence of magnetic field 746) on the magnetic field 742 will change the amount of current induced in the second coil 745. Therefore, in this example the characteristic that measurement circuit 750 is configured to measure is current induced in the second coil 745 (such as peak current, average current, etc), which is indicative of the electric field between the first sensing element 740 and the conductive element 230. Optionally, the measured characteristic of current may be compared against a reference value that is indicative of the optical device 220 being correctly positioned (similarly to the above description of the determined capacitance being compared against a reference capacitance). Thus, it can be seen that damage/removal/dislodging/mis-alignment, etc, of the optical device 220 may be detected without requiring a physical electrical connection to the optical device 220.

Figure 8A:
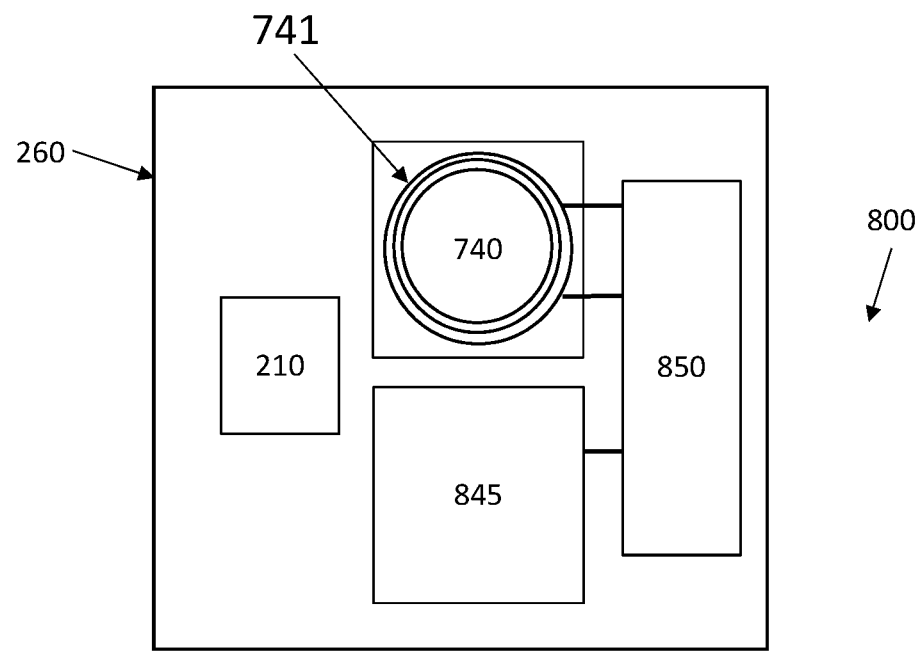
FIG. 8A shows an example schematic representation of a laser system/assembly in accordance with a further aspect of the present disclosure.

FIG. 8A shows an example schematic representation of a top-down view of a laser system/assembly 800 in accordance with an aspect of the present disclosure. The system 800 is very similar to the system 700, but the characteristic measured to detect changes in the magnetic field is different.

The system 800 comprises the first sensing element 740 and coil 741 as described above. The coil 741 is coupled to a measurement circuit 850. The system 800 also comprises a sensor 845 that is coupled to the measurement circuit 850. The measurement circuit 850 is configured to apply an alternating current to the coil 741 to induce a magnetic field, in the same way as described above.

Figure 8B:
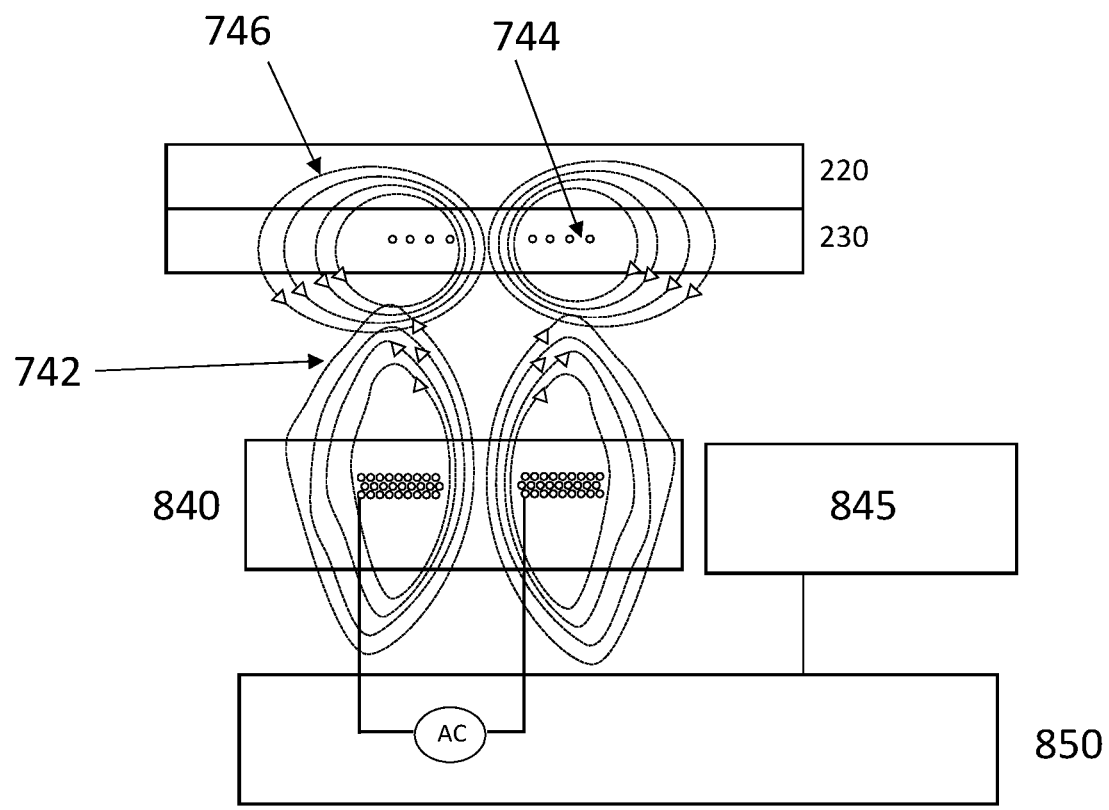
FIG. 8B shows an example schematic, side-on, representation of magnetic fields of the laser system/assembly of FIG. 8A.

FIG. 8B shows a representation of the magnetic field (B-field) 742 induced by an alternating current applied to the coil 741. It also shows eddy currents 744 in the at least one conductive element 746, and the induced magnetic field 746, as described above with reference to FIG. 7B. Also as described above, the magnetic field 746 has an effect on the magnetic field 742.

The sensor 845 is configured to measure the magnetic field between the first sensing element 840 and the conductive element 230 (for example, it may be a suitably configured hall sensor, or magneto resistor sensor such as AMR, GMR or TMR, and may be capable of measuring magnetic field strength and/or magnetic field angle). If the diffuser 220 is damaged or changes position, especially if the optical device is removed entirely, the change in magnetic field 746 (or the absence of magnetic field 746) will change the magnetic field measured by the sensor 845. Therefore, the measurement circuit 850 may be configured in any suitable way to measure the magnetic field using the sensor 845. Optionally, the measured magnetic field may be compared against a reference value that is indicative of the optical device 220 being correctly positioned (similarly to the above description of the determined capacitance being compared against a reference capacitance). Thus, it can be seen that damage/removal/dislodging/mis-alignment, etc, of the optical device 220 may be determined without requiring a physical electrical connection to the optical device 220.

In each of the examples described above with reference to FIGS. 6-8, the laser systems are configured to sense the optical device 220 by measuring a characteristic that is indicative of a magnetic field between the first conductive sensing element and the at least one conductor 230. In one example, the measured characteristic is inductance of the loop 641 (which changes with changes in the magnetic field), in another example the measured characteristic is current induced in the second coil 745 (which changes with changes in the magnetic field) and in another example the measured characteristic is the sensed magnetic field.

Similarly, FIGS. 2 to 5 all describe measuring a capacitance that is affected by a capacitance between the first sensing element and the at least one conductive element 230 on the optical device 220. It will be appreciated, however, that the capacitance between the first sensing element and the at least one conductive element 230 depends on an electric field between the first sensing element and the at least one conductive element 230. Therefore, in those examples, the measured characteristic is inherently indicative of the electric field between the first sensing element and the at least one conductive element 230.

Consequently, in all examples above, the sensing/measurement circuits of the laser systems are configured to sense the integrity of the optical device 220 by measuring a characteristic (for example, capacitance, inductance, induced current, magnetic field, etc) that is indicative of a field (such as an electric field or a magnetic field) that is affected or changed with changes to the at least one conductive element 230 (such as damage to the at least one conductive element and/or a change in position of the at least one conductive element 230 relative to the first sending element 240).

Thus, it can be seen that according to the disclosures herein, the laser system can be configured such that a potentially dangerous change to the optical device 220 can be quickly detected. Furthermore, the sensing is indirect/non-contact, in that there are no electrical connections (for example, wiring) between the sensing circuit 260 and the optical device 220, which keeps manufacture of the laser system straightforward and relatively low cost.

The skilled person will readily appreciate that various alterations or modifications may be made to the above described aspects of the disclosure without departing from the scope of the disclosure.

For example, in the capacitance implementation more than two capacitive sensing elements 240, 245 may be included in the laser system 200, such as three, or four. The mutual capacitance between two or more pairs of these elements may be determined by the measurement circuit 250, which may help to improve the accuracy with which changes to the optical device 220 are sensed.

In the above capacitance examples, the dielectric between capacitor plates is typically a gas, for example air. However, it may be any suitable type of dielectric. For example, there may be a liquid or solid dielectric between the two capacitive sensing elements 240 and 245, and a gaseous dielectric between the capacitive sensing elements 240, 245 and the at least one conductive element 230. In a further example, there may be a solid dielectric between the capacitive sensing elements 240, 245 and the at least one conductive element 230, which may or may not be optically transparent, depending on its positioning relative to the laser 210.

Whilst in the above capacitance examples there are two capacitive sensing elements 240, 245 and the mutual capacitance between them is measured, in an alternative a single capacitive sensing element may be provided. In this case, the capacitance of the capacitive coupling between the capacitive sensing element and the at least one conductive element 230 may be measured in order to sense the optical device 220. However, in this case, there may need to be a single physical electrical connection(s) to at least some of the at least one conductive element 230 so that the capacitance between the capacitive sensing element 240 and the at least one conductive element 230 may be measured, or in order to ground one plate of the capacitive coupling, such that the grounded capacitance is measured. However, in this case, there still would not need to be any physical electrical connection between the sensing circuit 250 and the at least one conductive element 230, since the conductive element would merely need to be held at some reference potential such as ground. Therefore, in this example of an optical device 232 with a single port electrical connection, the sensing performed by the measurement circuit would still be indirect/non-contact sensing of the optical device 220, which simplifies manufacture compared with direct sensing systems that require one or more electrical connections between the optical device 220 and the sensing circuit. As a result, it can be seen that in all of the aspects of the present disclosure, the optical device 220 is either a non-contact device (in that it does not have any electrical connection ports and the conductive elements are passive/isolated) or a single-port device (in that it has one electrical connection port for connection to a reference potential), but even in the case of a single-port device there is still no physical electrical connection to the sensing circuit.

Whilst in the above magnetic field sensing examples there is always at least one coil within the housing 260 that is driven by an AC signal, in an alternative that coil may instead be formed on a part of the optical device 220 and electrically coupled to the measurement circuit 650, 750, 850 for driving with the AC signal. In this alternative, the at least one conductive element 230 may be the coil on the optical device 220, and it may be optically transparent (such as ITO), or not optically transparent. In this example, the first sensing element may be omitted and the system may then comprise the second sensing element 745 or the sensor 845 described earlier in order to measure a characteristic indicative of the magnetic field induced by the AC signal. Changes in the optical device 220 will change the magnetic field at the second conductive sensing element 745 or the sensor 845, such that the optical device can be sensed from the measured characteristic. In this particular example embodiment, the system would be configured for direct/contact sensing of the optical device 220, in that there would be an electrical connection between the optical device and the sensing circuit. However, it may enable multiple different modalities of sensing to be employed by changing the nature of the signals applied to the at least one conductive element 230, for example to enable measurements of impedance and resistance of the at least one conductive element and measurement of the magnetic field generated by the at least one conductive element, all of which may be indicative of the integrity of the optical element. As a result the system may have a degree of redundancy such that the reliability and therefore safety of sensing may be improved. In particular, there would be two different types of sensing taking place, such that even if one of the types is incorrect and falsely indicates that the optical device still has integrity, the other type of sensing should still detect that there is an integrity problem. In a further similar example aspect, capacitance/electric field sensing may be employed within a direct/contact sensing system. In this particular example, the at least one conductive element 230 may be electrically connected to the sensing circuit and the sensing circuit configured to apply a suitable signal (such as a voltage) to the at least one conductive element and measure the capacitance between the at least one conductive element 230 and the capacitive sensing element 240 and/or capacitive sensing element 250. This may be again be particularly useful for providing redundancy in two-port, impedance sensing systems that include two electrical connection ports to the optical device for impedance sensing. For example, if there were a fault in the sensing circuit that incorrectly measures the impedance/resistance is indicating that there is integrity in the optical device, or if the optical device were removed and replaced with a resistor, the electrical field sensing may still reveal there is an integrity problem. Thus, by implementing field sensing in accordance with the present disclosure, even in direct/contact sensing systems, additional safety and redundancy may be achieved.

The measurement circuits in each of the examples referenced in FIGS. 2-8 may be separate from a laser driver configured to drive the laser 210, or may be part of the laser driver. Furthermore, whilst in each of the examples above the sensing elements 240, 245, 640, 740, 745 840 are all implemented as standalone components in the housing 260 (for example, mounted on a PCB), they may alternatively be positioned in any suitable location. For example, they may be integrated on the laser driver, or may be integrated on the laser 210. Likewise, the sensor 845 in the example of FIG. 8 may be positioned in any suitable location, including, for example, integrated on the laser driver, or integrated on the laser 210.

Whilst in the above examples relating to capacitance determination, the optical device 220 comprises at least one conductive element 230, in an alternative the optical device 220 may not comprise any conductive element 230. In this case, the optical device 220 may effectively act as a dielectric with a different permittivity to the other dielectric that is in the vicinity of the capacitive sensing elements 240, 245 (usually air). Consequently, if the optical device 220 is removed or damaged, this may affect the capacitance between the capacitive sensing elements 240, 245, since the effective permittivity of dielectric in the electric field between the capacitive sensing elements 240, 245 may change. Thus, the optical device 220 may still be sensed even without the optical device 220 having at least one conductive element 230.

Whilst the Figures show the laser 210, the sensing elements and the measurement circuit all being directly fixed to the housing 260, it will be appreciated that any suitable assembly and mounting of the components may alternatively be used. For example, different components may be mounted at different levels and positions within the housing 260, such as the capacitive sensing elements 240, 245 or the inductive coil sensing element 640 being positioned on one or more elevated planes, between the plane on which the laser 210 is mounted and below the plane of the optical device 220. Furthermore, the housing 260 represented in the Figures may be of any suitable design/shape and is not limited by the example representation in the Figures.

Throughout this disclosure, the term "electrically coupled" or "electrically coupling" encompasses both a direct electrical connection between components, or an indirect electrical connection (for example, where the two components are electrically connected via at least one further component). The term "electrical connection" means a physical electrical connection between two components, such as a wired connection.

The invention claimed is:

1. A laser system comprising:
a housing;
a laser light source in the housing;
an optical device fitted to the housing and arranged such that laser light emitted by the laser light source passes through the optical device;
at least one conductive element formed on at least part of the optical device;
a first sensing element and a second sensing element in the housing; and
a measurement circuit electrically coupled to the first sensing element and electrically coupled to the second sensing element, wherein the measurement circuit is configured to measure a characteristic that is indicative of a field between the at least one conductive element, the first sensing element, and the second sensing element.

2. The laser system of claim 1, wherein the field between the at least one conductive element and the first sensing element comprises an electric field, and wherein the measured characteristic comprises a capacitance that is dependent on the electric field.

3. The laser system of claim 2,
wherein the measured characteristic comprises a mutual capacitance between the first sensing element and the second sensing element.

4. The laser system of claim 3, wherein the measured characteristic is further indicative of an electric field between the at least one conductive element and the second sensing element.

5. The laser system of claim 2, wherein the first sensing element is a conductive element arranged to be capacitively coupled to the at least one conductive element.

6. The laser system of claim 1, wherein the field between the at least one conductive element and the first sensing element comprises a magnetic field, and wherein the first sensing element comprises a first coil, and wherein the measurement circuit is configured to apply a current to the first coil to induce a first magnetic field.

7. The laser system of claim 6, wherein the characteristic comprises an inductance of the first coil.

8. The laser system of claim 7, wherein the measurement circuit comprises a capacitor that is coupled to the first coil to form an LC tank, and wherein the measurement circuit is configured to measure the inductance of the first coil by determining a resonant frequency of the LC tank.

9. The laser system of claim 6, wherein the second sensing element comprises a second coil coupled to the measurement circuit, and wherein the characteristic comprises a current induced in the second coil by the first magnetic field.

10. The laser system of claim 6, further comprising a magnetic sensor coupled to the measurement circuit, and wherein the characteristic comprises the first magnetic field measured using the magnetic sensor.

11. The laser system of claim 1, wherein the measurement circuit is further configured to compare the measured characteristic against a reference value to determine whether or not the optical device should be functioning correctly.

12. The laser system of claim 11, wherein operation of the laser light source is based at least in part on the comparison of the measured characteristic against the reference value.

13. The laser system of claim 1, wherein the at least one conductive element is formed as a film layer on at least part of a surface of the optical device.

14. The laser system of claim 1, wherein the optical device is a non-contact optical device such that it does not have any electrical connection ports.

15. The laser system of claim 1, included in or in combination with a time of flight camera system.

16. A method for sensing an optical device within a laser system, wherein the optical device comprises at least one conductive element formed on at least part of the optical device, and wherein the laser system comprises a laser light source, arranged such that emitted laser light passes through the optical device, a first sensing element mounted in a fixed position relative to the laser light source, and a second sensing element mounted in a fixed position relative to the laser light source, the method comprising:

sensing the optical device by measuring a characteristic that is indicative of a field between the at least one conductive element, the first sensing element, and the second sensing element using respective electrical connections to the first sensing element and the second sensing element.

17. A laser assembly comprising:
a laser;
an optical device comprising at least one conductive element, wherein the optical device is arranged to alter light emitted from the laser;
a first coil;
a sensing circuit electrically coupled to the first coil, the sensing circuit configured to measure a characteristic indicative of a field that is affected by the optical device, wherein the field is generated by the first coil; and
wherein the sensing circuit is not electrically connected to the at least one conductive element.

18. The laser assembly of claim 17, wherein the field that is affected by the optical device is a magnetic field generated using the first coil, and wherein the sensing circuit is configured to measure an inductance of the first coil.

19. The laser assembly of claim 17, wherein the field that is affected by the optical device is a magnetic field generated using the first coil, and wherein the sensing circuit is configured to measure the magnetic field using a first sensing element.

20. The laser assembly of claim 17, wherein the optical device is a non-contact optical device that does not require any electrical connection ports.

* * * * *